US011756956B2

(12) United States Patent
Zhu

(10) Patent No.: US 11,756,956 B2
(45) Date of Patent: Sep. 12, 2023

(54) SEMICONDUCTOR DEVICE, MANUFACTURING METHOD THEREOF, AND ELECTRONIC APPARATUS INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 348 days.

(21) Appl. No.: 16/958,594

(22) PCT Filed: May 25, 2018

(86) PCT No.: PCT/CN2018/088391
§ 371 (c)(1),
(2) Date: Jun. 26, 2020

(87) PCT Pub. No.: WO2019/128076
PCT Pub. Date: Jul. 4, 2019

(65) Prior Publication Data
US 2020/0357795 A1 Nov. 12, 2020

(30) Foreign Application Priority Data
Dec. 27, 2017 (CN) .......................... 201711452695.7

(51) Int. Cl.
H01L 27/088 (2006.01)
H01L 21/8234 (2006.01)
(Continued)

(52) U.S. Cl.
CPC .......... H01L 27/088 (2013.01); H01L 21/308 (2013.01); H01L 21/3065 (2013.01);
(Continued)

(58) Field of Classification Search
CPC .......... H01L 29/7827; H01L 29/41741; H01L 29/66666; H01L 29/78642; H01L 29/0847;
(Continued)

(56) References Cited

U.S. PATENT DOCUMENTS

2004/0135256 A1  7/2004  Takahashi et al.
2009/0152611 A1  6/2009  Fujimoto
(Continued)

FOREIGN PATENT DOCUMENTS

CN       1499637      5/2004
CN       102832221    12/2012
(Continued)

OTHER PUBLICATIONS

First Chinese Office Action, issued in the corresponding Chinese application No. 201711452695.7, dated Feb. 24, 2020, 11 pages.
(Continued)

Primary Examiner — Michael M Trinh
(74) Attorney, Agent, or Firm — Hamre, Schumann, Mueller & Larson, P.C.

(57) ABSTRACT

Disclosed is a semiconductor device comprising: a substrate; a vertical active region formed on the substrate and comprising a first source/drain region, a channel region, and a second source/drain region sequentially disposed in a vertical direction, the first source/drain region including a laterally extending portion extending beyond a portion of the active region above the laterally extending portion; a gate stack formed around the periphery of the channel region, the gate stack including a laterally extending portion; and a
(Continued)

stack contact portion from above the laterally extending portion of the first source/drain region to the laterally extending portion of the first source/drain region. The stack contact portion comprises a three-layer structure sequentially disposed in the vertical direction: a lower layer portion, a middle layer portion, and an upper layer portion. The lower layer portion contains at least the same element as the first source/drain region, the middle layer portion contains at least the same element as the channel region, and the upper layer portion contains at least the same element as the second source/drain region.

15 Claims, 18 Drawing Sheets

(51) Int. Cl.
| | |
|---|---|
| *H01L 29/417* | (2006.01) |
| *H01L 29/78* | (2006.01) |
| *H01L 21/3065* | (2006.01) |
| *H01L 21/308* | (2006.01) |
| *H01L 29/08* | (2006.01) |
| *H01L 29/45* | (2006.01) |
| *H01L 29/66* | (2006.01) |

(52) U.S. Cl.
CPC ............ *H01L 21/823418* (2013.01); *H01L 21/823475* (2013.01); *H01L 21/823487* (2013.01); *H01L 29/0847* (2013.01); *H01L 29/41741* (2013.01); *H01L 29/45* (2013.01); *H01L 29/66545* (2013.01); *H01L 29/66666* (2013.01); *H01L 29/66977* (2013.01); *H01L 29/7827* (2013.01); *H01L 29/7848* (2013.01)

(58) Field of Classification Search
CPC ............ H01L 29/7848; H01L 29/7391; H01L 29/66356; H01L 29/7843; H01L 29/1033; H01L 29/66545; H01L 29/665; H01L 29/66507

See application file for complete search history.

(56) References Cited

U.S. PATENT DOCUMENTS

| | | | | |
|---|---|---|---|---|
| 2011/0303973 | A1* | 12/2011 | Masuoka | H01L 29/42384 257/329 |
| 2013/0069149 | A1* | 3/2013 | Masuoka | H01L 29/78642 438/270 |
| 2015/0357445 | A1* | 12/2015 | Chuang | H01L 29/66977 438/268 |
| 2017/0110559 | A1 | 4/2017 | Chuang et al. | |
| 2017/0365712 | A1 | 12/2017 | Bu et al. | |
| 2017/0365714 | A1 | 12/2017 | Bu et al. | |
| 2017/0373162 | A1* | 12/2017 | Cheng | H01L 29/66795 |
| 2018/0096896 | A1* | 4/2018 | Zhu | H01L 29/78642 |
| 2018/0097111 | A1* | 4/2018 | Zhu | H01L 21/823807 |
| 2021/0335789 | A1* | 10/2021 | Zhu | G11C 11/4097 |

FOREIGN PATENT DOCUMENTS

| | | |
|---|---|---|
| CN | 106158935 | 11/2016 |
| CN | 106252352 | 12/2016 |
| CN | 106298875 | 1/2017 |
| CN | 108198815 | 6/2018 |

OTHER PUBLICATIONS

Second Chinese Office Action, issued in the corresponding Chinese application No. 201711452695.7, dated Jul. 21, 2020, 28 pages.
International Search Report, issued in the corresponding PCT application No. PCT/CN2018/088391, dated Aug. 22, 2018, 6 pages.

* cited by examiner

SEMICONDUCTOR DEVICE, MANUFACTURING METHOD THEREOF, AND ELECTRONIC APPARATUS INCLUDING THE SAME

TECHNICAL FIELD

The present disclosure relates to the field of semiconductors, and in particular, to a vertical type semiconductor device and a manufacturing method thereof, and an electronic apparatus including the semiconductor device.

BACKGROUND

In a horizontal type device such as a metal oxide semiconductor field effect transistor (MOSFET), a source, a gate, and a drain are arranged in a direction substantially parallel to a substrate surface. Due to this arrangement, in order to reduce an area occupied by the horizontal type device, the areas occupied by the source, the drain, and the gate are generally required to be reduced, resulting in poor device performance (for example, increased power consumption and resistance). Thus, it is not easy to further reduce the area of the horizontal type device. By contrast, in a vertical type device, a source, a gate, and a drain are arranged in a direction substantially perpendicular to a substrate surface. Therefore, it is easier to reduce an area occupied by the vertical type device than the horizontal type device.

SUMMARY

In view of this, an object of the present disclosure is to provide, at least in part, a vertical type semiconductor device having improved performance, a method of manufacturing the same, and an electronic apparatus including the semiconductor device.

According to an aspect of the present disclosure, there is provided a semiconductor device including: a substrate; a vertical active region formed on the substrate, including a first source/drain region, a channel region, and a second source/drain region sequentially disposed in a vertical direction, the first source/drain region including a laterally extending portion extending beyond a portion of the active region above the laterally extending portion; a gate stack formed around a periphery of the channel region, the gate stack including a laterally extending portion; a stack contact portion from above the laterally extending portion of the first source/drain region to the laterally extending portion of the first source/drain region.

According to an aspect of the present disclosure, there is provided a method of manufacturing a semiconductor device including: providing an active region material layer on a substrate; and patterning the active region material layer to define a vertical active region and a second contact portion; wherein when patterning the active region material layer, the patterning of the active region material layer is stopped before reaching a bottom surface of the active region material layer, so that the active region material layer is patterned as a first stack serving as the vertical active region and a second stack serving as the second contact portion, and the first stack and the second stack are connected together at the bottom.

According to another aspect of the present disclosure, there is provided an electronic apparatus including an integrated circuit formed of the semiconductor device described above.

According to an embodiment of the present disclosure, the second contact portion is formed as a pillar juxtaposed with the vertical active region, thereby avoiding the formation of high-depth contact holes, increasing integration density and reducing the difficulty of forming the contact portion. Thus, metal contact portions with high aspect ratios can be formed (avoiding the process difficulty of, for example, etching contact holes using a plasma etching method and refilling the contact holes with materials such as metal), and a risk of lithographic misalignment can be reduced due to the reduced photolithography steps, thereby further increasing integration density. In addition, manufacturing costs are reduced due to the lack of dual patterning.

BRIEF DESCRIPTION OF THE DRAWINGS

The above and other objects, features, and advantages of the present disclosure will be more apparent from the following description of the embodiments of the present disclosure with reference to the accompanying drawings, in which.

Throughout the drawings, the same or similar reference numerals indicate the same or similar components.

DETAILED DESCRIPTION

Figure 1:
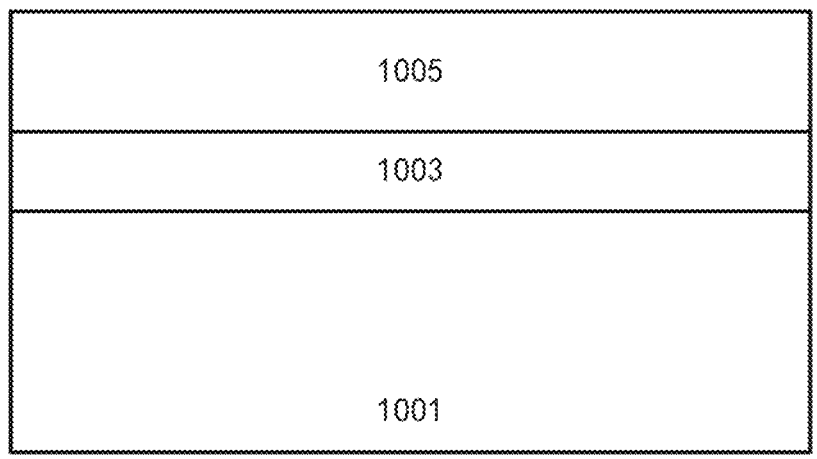
FIGS. 1 to 12 are schematic views illustrating a flow of manufacturing a semiconductor device according to an embodiment of the present disclosure.

Hereinafter, embodiments of the present disclosure will be described with reference to the drawings. It should be understood, however, that these descriptions are merely exemplary and are not intended to limit the scope of the present disclosure. In addition, in the following description, descriptions of well-known structures and technologies are omitted to avoid unnecessarily obscuring the concepts of the present disclosure.

Various structural diagrams according to the embodiments of the present disclosure are shown in the drawings. These figures are not drawn to scale, wherein some details may be exaggerated for clarity and some details may be omitted. The shapes of the various regions, layers, and their relative sizes and positional relationships shown in the figures are only exemplary. In practice, there may be deviations due to manufacturing tolerances or technical limitations. It is possible for those skilled in the art to additionally design other regions/layers with different shapes, sizes, and relative positions as necessary.

In the context of this disclosure, when a layer/element is referred to as being "on" another layer/element, it can be directly on the other layer/element, or there may be an intervening layer/element there between. In addition, if a layer/element is "above" another layer/element in one orientation, then the layer/element may be "below" the other layer/element when the orientation is reversed.

A vertical type semiconductor device according to an embodiment of the present disclosure may include a first source/drain layer, a channel layer, and a second source/drain layer sequentially stacked on a substrate. The layers may be adjacent to each other, of course, there may be other semiconductor layers among them, such as a leakage suppression layer and/or an on-state current enhancement layer (a semiconductor layer with a larger or smaller band gap than adjacent layers). Source/drain regions of the device may be formed in the first source/drain layer and the second source/drain layer, and a channel region of the device may be formed in the channel layer. According to an embodiment of the present disclosure, such a semiconductor device may be a conventional field effect transistor (FET). In the case of an FET, the first source/drain layer and the second source/drain layer (or the source/drain regions on both sides of the channel layer) may be doped with the same conductivity type (for example, n-type or p-type). A conductive channel may be formed between the source/drain regions located at both ends of the channel region through the channel region. Alternatively, such a semiconductor device may be a tunneling FET. In the case of a tunneling FET, the first source/drain layer and the second source/drain layer (or the source/drain regions on both sides of the channel layer) may be doped with different conductivity types (for example, n-type and p-type). In this case, charged particles such as electrons can tunnel through the channel region from the source region and enter into the drain region, thereby forming a turning-on path between the source region and the drain region. Although conventional FETs and tunneling FETs have different turning-on mechanisms, they both exhibit electrical performance in which the gate can be used to control the turning-on/off between the source/drain regions. Therefore, the terms "source/drain layer (source/drain region)" and "channel layer (channel region)" are uniformly used to describe the conventional FET and tunneling FET, although there is no "channel" in a general meaning in the tunneling FET.

A gate stack may be formed around the periphery of the channel layer. Therefore, the gate length may be determined by the thickness of the channel layer itself, instead of relying on time-consuming etching as in the conventional technique. The channel layer may be formed, for example, by epitaxial growth, so that its thickness may be well controlled. Therefore, the gate length may be well controlled. The periphery of the channel layer may be recessed inwardly with respect to the periphery of the first and second source/drain layers. In doing so, the formed gate stack may be embedded in the recess of the channel layer relative to the first and second source/drain layers. Preferably, a range of the gate stack in the overlapping direction (vertical direction, for example, substantially perpendicular to the substrate surface) of the first source/drain layer, the channel layer, and the second source/drain layer is within a range of the recess in this direction. Therefore, the overlapping with the source/drain regions can be reduced or even avoided, which contributes to reducing parasitic capacitances between the gate and the source/drain.

The channel layer may be composed of monocrystalline semiconductor materials, such as monocrystalline silicon, or silicon germanium (SiGe) to improve device performance. Likewise, the first and second source/drain layers may also be composed of monocrystalline semiconductor materials. In this case, the monocrystalline semiconductor material of the channel layer and the monocrystalline semiconductor material of the source/drain layer may be eutectic. The electron or hole mobility of the channel layer monocrystalline semiconductor material may be greater than the electron or hole mobility of the first and second source/drain layers. In addition, the band gap of the first and second source/drain layers may be greater than that of the channel layer monocrystalline semiconductor material.

According to an embodiment of the present disclosure, the channel layer monocrystalline semiconductor material may have the same crystal structure as the first and second source/drain layers. In this case, the lattice constant of the first and second source/drain layers without strain may be greater than the lattice constant of the channel layer monocrystalline semiconductor material without strain. Thus, the carrier mobility of the channel layer monocrystalline semiconductor material may be greater than the carrier mobility thereof without strain, or the effective mass of the carriers of the channel layer monocrystalline semiconductor material may be less than the effective mass of carriers thereof without strain, or the concentration of lighter carriers of the channel layer monocrystalline semiconductor material may be greater than the concentration of lighter carriers thereof without strain. Alternatively, the lattice constant of the first and second source/drain layers without strain may be less than the lattice constant of the channel layer monocrystalline semiconductor material without strain. Therefore, when the <110> direction of the channel layer monocrystalline semiconductor material is parallel to a current density vector between the source and drain, the electron mobility of the channel layer monocrystalline semiconductor material is greater than the electron mobility thereof without strain, or the effective mass of the electrons of the channel layer monocrystalline semiconductor material is less than the effective mass of the electrons thereof without strain.

According to an embodiment of the present disclosure, the doping for the source/drain regions may partially enter into ends of the channel layer close to the first source/drain layer and the second source/drain layer. As a result, doping distribution is formed at the ends of the channel layer close to the first source/drain layer and the second source/drain layer, which contributes to reducing the resistance between the source/drain regions and the channel region when the device is turned on, thereby improving device performance.

According to an embodiment of the present disclosure, the channel layer may include a semiconductor material different from the first and second source/drain layers. As such, it is advantageous to perform processing, such as selective etching, on the channel layer in order to cause it to recess with respect to the first and second source/drain layers. In addition, the first source/drain layer and the second source/drain layer may include the same semiconductor material.

For example, the first source/drain layer may be the semiconductor substrate itself. In this case, the channel layer may be a semiconductor layer epitaxially grown on the substrate, and the second source/drain layer may be a semiconductor layer epitaxially grown on the channel layer. Alternatively, the first source/drain layer may be a semiconductor layer epitaxially grown on the substrate. In this case, the channel layer may be a semiconductor layer epitaxially grown on the first source/drain layer, and the second source/drain layer may be a semiconductor layer epitaxially grown on the channel layer.

According to an embodiment of the present disclosure, a stress liner may be further provided on the surfaces of the first source/drain layer and the second source/drain layer. For n-type devices, the stress liner may be under compressive stress to generate tensile stress in the channel layer; and for p-type devices, the stress liner may be under tensile stress to generate compressive stress in the channel layer. Therefore, device performance can be further improved.

According to an embodiment of the present disclosure, the position of the stack contact portion is substantially automatically aligned in a horizontal direction with the positions of the first source/drain region, the channel region, and the second source/drain region constituting the vertical active region, respectively.

According to an embodiment of the present disclosure, a part of elements constituting the stack contact portion is the same as elements constituting the first source/drain region or the channel region or the second source/drain region.

The stack contact portion may include compound materials composed of metal elements and semiconductor elements, and one of the semiconductor elements is at least the same as one of the semiconductor elements in the first source/drain region or the channel region or the second source/drain region.

According to an embodiment of the present disclosure, the stack contact portion and/or the laterally extending portion of the first source/drain region may include a doped semiconductor.

According to an embodiment of the present disclosure, the stack contact portion may include a three-layer structure sequentially arranged in a vertical direction: a lower layer portion, a middle layer portion, and an upper layer portion. The lower layer portion includes at least the same element as that forming the first source/drain region, the middle layer portion includes at least the same element as that forming the channel region, and the upper layer portion includes at least the same element as that forming the second source/drain region. The lower layer portion may include a compound composed of a first metal element and a semiconductor element, the middle layer portion may include a compound composed of a second metal element and a semiconductor element, and the upper layer portion may include a compound composed of a third metal element and a semiconductor element. One of the semiconductor elements in the compound of the lower layer portion may be the same as one of the semiconductor elements in the first source/drain region, one of the semiconductor elements in the compound of the middle layer portion may be the same as one of the semiconductor elements in the channel region, and one of the semiconductor elements in the compound of the upper layer portion may be the same as one of the semiconductor elements in the second source/drain region. The compound material may include a metal silicide material or a metal silicide germanide material, or a combination thereof.

According to an embodiment of the present disclosure, the compound of the lower layer portion is on the same level as the first source/drain region, the compound of the middle layer portion is on the same level as the channel region, and the compound of the upper layer portion is on the same level as the second source/drain region.

According to an embodiment of the present disclosure, at least part of the exterior of the stacked contact is covered with a metal layer. And the metal layer includes any one of the following: tungsten, cobalt, titanium, nickel, copper, molybdenum, aluminum, silver, beryllium, ruthenium, calcium, or a combination thereof.

According to an embodiment of the present disclosure, the device further includes a second contact plug from above the stack contact portion to the stack contact portion. The device may further include a third contact plug to a gate conductor layer in the laterally extending portion of the gate stack, as a third contact portion.

According to an embodiment of the present disclosure, the stack contact portion further includes a dummy gate stack structure formed in a recess surrounding the middle layer portion on the same level as the channel region. The dummy gate stack structure includes an insulating layer and a conductive layer sequentially stacked and formed in the recess. The insulating layer may include a low-K dielectric material. The conductive layer may form an electrical connection with a portion of the laterally extending portion of the gate stack.

According to an embodiment of the present disclosure, the device may further include another electrode forming an electrical connection with the laterally extending portion of the gate stack through the conductive layer. This electrode may be other electrode in the device or an electrode in other devices.

Such a semiconductor device can be manufactured as follows. Specifically, a stack of a first source/drain layer, a channel layer, and a second source/drain layer may be provided on a substrate. As described above, the first source/drain layer may be provided by the substrate itself or by epitaxial growth on the substrate. Next, the channel layer may be epitaxially grown on the first source/drain layer, and the second source/drain layer may be epitaxially grown on the channel layer. During epitaxial growth, the thickness of the grown channel layer may be controlled. Due to the respective epitaxial growth, there may be clear crystal interfaces between at least some adjacent layers. In addition, each layer may be doped differently, and thus, there may be doping concentration interfaces between at least some adjacent layers.

For the stacked first source/drain layer, the channel layer, and the second source/drain layer, an active region may be defined therein. For example, they may be selectively etched sequentially into a desired shape. Generally, the active region may be columnar (for example, cylindrical). In order to facilitate the connection of the source/drain region formed in the first source/drain layer in subsequent processes, the first source/drain layer may be etched only on the upper portion thereof, so that the lower portion of the first source/drain layer may extend beyond the periphery of its upper portion. Then, a gate stack may be formed around the periphery of the channel layer.

Further, the periphery of the channel layer may be recessed inwardly with respect to the peripheries of the first and second source/drain layers, so as to define a space for accommodating the gate stack. This can be achieved, for example, by selective etching. In this case, the gate stack may be embedded in the recess.

Source/drain regions may be formed in the first and second source/drain layers. For example, this can be achieved by doping the first and second source/drain layers. For example, ion implantation, plasma doping, or in-situ doping when growing the first and second source/drain layers may be performed. According to one advantageous embodiment, a sacrificial gate may be formed in the recess which is formed on the periphery of the channel layer with respect to the peripheries of the first and second source/drain layers, and then a dopant source layer may be formed on the surfaces of the first and second source/drain layers, and the dopant in the dopant source layer may enter into the active region through the first and second source/drain layers by, for example, annealing. The sacrificial gate may prevent the dopant in the dopant source layer from directly entering into the channel layer. However, a part of the dopant may enter into an end of the channel layer close to the first source/drain layer and the second source/drain layer through the first and second source/drain layers.

The present disclosure may be embodied in various forms, some examples of which will be described below.

FIGS. 1 to 12 illustrate a flowchart of manufacturing a semiconductor device according to an embodiment of the present disclosure.

As shown in FIG. 1, a substrate 1001 is provided. The substrate 1001 may be various types of substrates, including but not limited to a bulk semiconductor material substrate such as a bulk Si substrate, a semiconductor on insulator (SOI) substrate, a compound semiconductor substrate such as a SiGe substrate, or the like. In the following description, for convenience of explanation, a bulk Si substrate is taken as an example for description.

A channel layer 1003 and another semiconductor layer 1005 may be sequentially formed on the substrate 1001 by, for example, epitaxial growth. For example, the channel layer 1003 may include a semiconductor material different from the substrate 1001 and the semiconductor layer 1005, such as SiGe (the atomic percentage of Ge may be about 10-40%), with a thickness being about 10-100 nm. And the semiconductor layer 1005 may include the same semiconductor material as the substrate 1001, such as Si, with a thickness being about 20-50 nm. However, the present disclosure is not limited thereto. For example, the channel layer 1003 may include a semiconductor material which has the same constituent components as the substrate 1001 or the semiconductor layer 1005, but different component contents (for example, both may be SiGe, but the atomic percentage of Ge is different), as long as the channel layer 1003 has an etching selectivity with respect to the substrate 1001 and the semiconductor layer 1005.

Figure 2A:
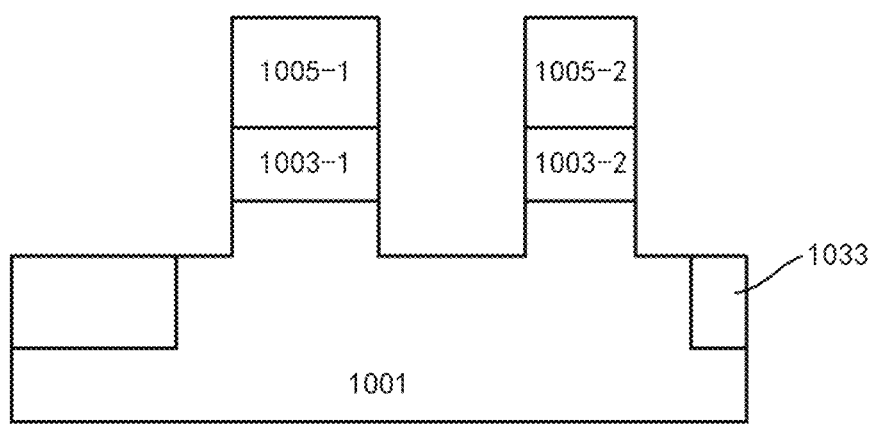
Figure 2B:
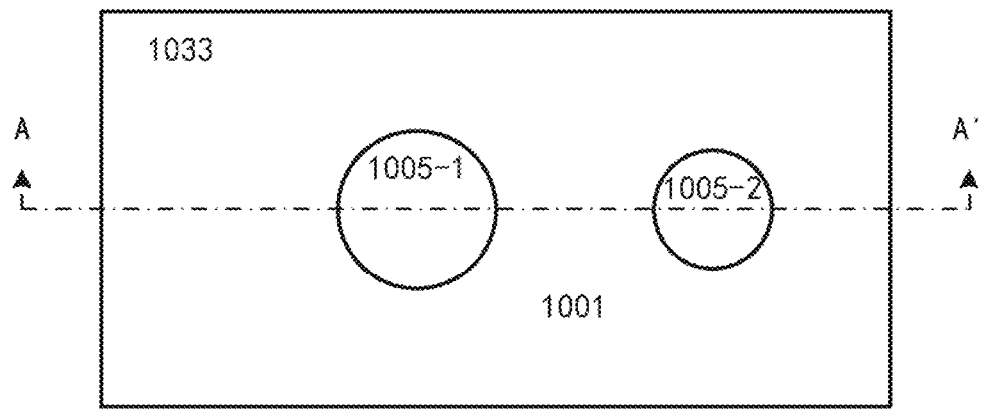

Next, an active region and a second contact portion of the device may be defined. For example, this can be done as follows. Specifically, as shown in FIGS. 2(a) and 2(b) (FIG. 2(a) is a cross-sectional view, and FIG. 2(b) is a top view, where AA' line indicates a position at which the cross section is taken), a photoresist (not shown) may be formed on the stack of the substrate 1001, the channel layer 1003, and the semiconductor layer 1005 as shown in FIG. 1, the photoresist is patterned into two desired shapes (in this example, which are approximately circular, but other shapes such as rectangles may also be used) by photolithography (exposure and development). By using the patterned photoresist as a mask, the semiconductor layer 1005, the channel layer 1003, and the substrate 1001 are selectively etched in sequence, such as reactive ion etching (RIE). The etching proceeds into the substrate 1001, but does not proceed to a bottom surface of the substrate 1001. Thus, after the etching, the semiconductor layer 1005, the channel layer 1003, and an upper portion of the substrate 1001 are formed into two pillars (in this example, cylindrical shapes). Accordingly, the semiconductor layer 1005 is formed into two parts: a first semiconductor layer 1005-1 and a second semiconductor layer 1005-2, and the channel layer 1003 is formed into two parts: a first channel layer 1003-1 and a second channel layer 1003-2. Since the patterning of the active region material layer is stopped before proceeding to the bottom surface of the substrate 1001, the active region material layer is patterned as a first stack (i.e., a pillar on the left) serving as an active region and a second stack (i.e., a pillar on the right) serving as a second contact portion, and the first stack and the second stack are connected together at the bottom. RIE may be performed, for example, in a direction substantially perpendicular to a substrate surface, so that the first stack and the second stack are also approximately perpendicular to the substrate surface. Thereafter, the photoresist may be removed.

A first isolation layer such as a shallow trench isolation layer 1033 may be formed around the first stack (the active region) and the second stack to achieve electrical isolation. For example, as shown in FIG. 2(a), a trench may be patterned on the structure, and an oxide may be deposited and etched back to a position on the upper surface of the bottom of the substrate 1001 to form the first isolation layer 1033. Prior to etch-back, the deposited oxide may be subjected to a planarization process such as chemical mechanical polishing (CMP) or sputtering. Herein, a top surface of the first isolation layer 1033 may be close to an interface between the channel layer 1003 and the substrate 1001.

Figure 3:
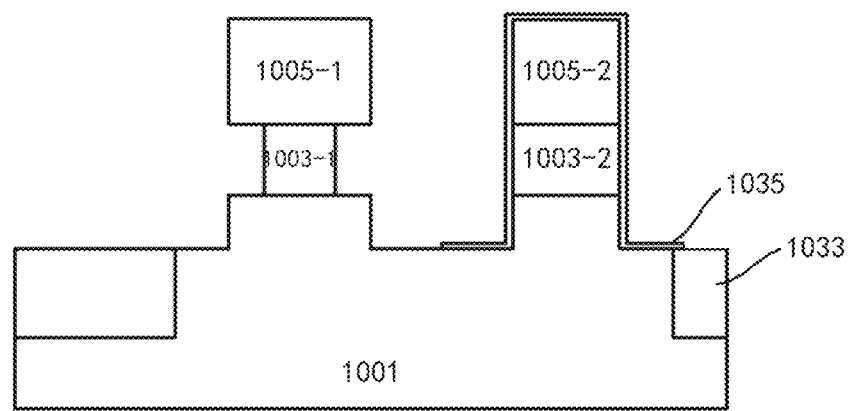

Then, as shown in FIG. 3, a periphery of the first channel layer 1003-1 may be recessed with respect to the peripheries of the substrate 1001 and the first semiconductor layer 1005-1 (in this example, recessed in a lateral direction substantially parallel to the substrate surface). For example, this can be achieved by performing further selective etching to the channel layer 1003-1 with respect to the substrate 1001 and the first semiconductor layer 1005-1. For example, atomic layer etching or digital etching may be used for selective etching. For example, a layer of nitrogen oxide is firstly covered on the right pillar (consisting of the second semiconductor layer 1005-2, the second channel layer 1003-2, and a part of the substrate 1001) by, for example, deposition, and then, is subjected to, for example, heat processing, so that another part of the substrate 1001, and the surfaces of the first channel layer 1003-1 and the first semiconductor layer 1005-1 are oxidized, and then their respective surface oxide layers are removed. When the first channel layer 1003-1 is SiGe and the substrate 1001 and the first semiconductor layer 1005-1 are Si, the oxidation rate of SiGe is higher than that of Si, and the oxide on SiGe is easier to remove. The oxidation-removal oxide step may be repeated to achieve a desired recess. Compared with selective etching, this method can better control the degree of recessing.

As such, the active region of the semiconductor device is defined (the left pillar as shown in FIG. 3, including the etched substrate 1001, especially the upper portion thereof, the first channel layer 1003-1, and the first semiconductor layer 1005-1). In this example, the active region is substantially columnar. In the active region, the periphery of the upper portion of the substrate 1001 and the periphery of the first semiconductor layer 1005-1 are substantially aligned, but the periphery of the first channel layer 1003-1 is relatively recessed. The upper and lower side walls of this recess are respectively defined by an interface between the first channel layer 1003-1 and the first semiconductor layer 1005-1 and an interface between the first channel layer 1003-1 and the substrate 1001.

However, the shapes of the active region and the second contact portion are not limited thereto, and other shapes may be formed according to a design layout. For example, in a top view, the active region and the second contact portion may be oval, square, rectangular, or the like.

Figure 4:
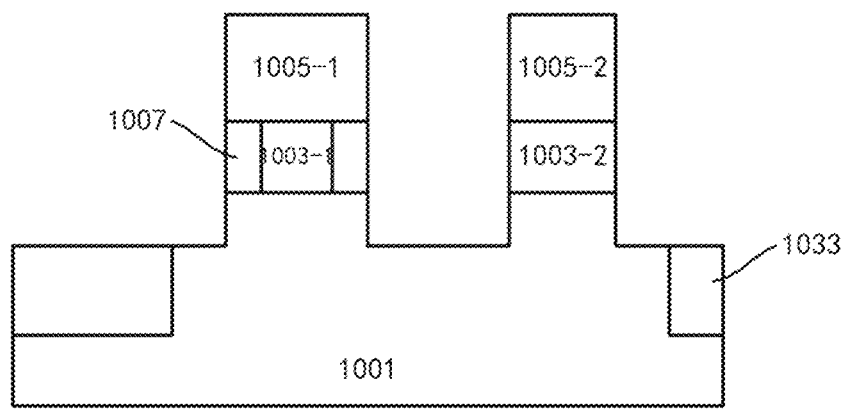

In the recess formed by the first channel layer 1003-1 with respect to the periphery of the upper portion of the substrate 1001 and the periphery of the first semiconductor layer 1005-1, a gate stack will be subsequently formed. In order to prevent subsequent processing from affecting the channel layer 1003 or leaving unnecessary material in the recess to affect the formation of the subsequent gate stack, a material layer may be filled in the recess to occupy a space for the gate stack (accordingly, this material layer may be referred to as a "sacrificial gate"). This can be done, for example, by depositing a nitrogen oxide on the structure shown in FIG. 3 and then performing etching-back such as RIE to the deposited nitrogen oxide. RIE may be performed in a direction substantially perpendicular to the substrate surface to remove excess nitrogen oxide, and at the same time remove the nitrogen oxide formed on the right pillar by the previous process, so that the nitrogen oxide may only remain in the recess to form a sacrificial gate 1007, as shown in FIG. 4. In this case, the sacrificial gate 1007 may substantially fill the above-mentioned recess.

Next, source/drain regions may be formed in the substrate 1001 and the first semiconductor layer 1005-1. This can be done by doping the substrate 1001 and the first semiconductor layer 1005-1. For example, this can be done as follows.

Figure 5:
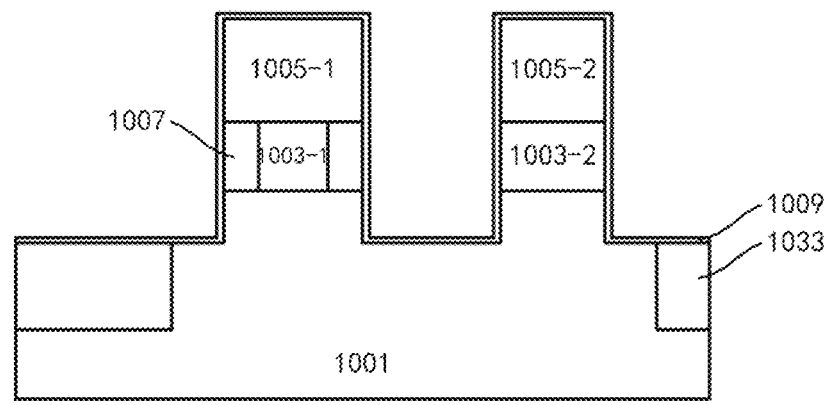

Specifically, as shown in FIG. 5, a dopant source layer 1009 may be formed on the structure shown in FIG. 4. For example, the dopant source layer 1009 may include an oxide such as silicon oxide, which contains a dopant. For an n-type device, an n-type dopant may be included; and for a p-type device, a p-type dopant may be included. Herein, the dopant source layer 1009 may be a thin film, so that it may be deposited substantially conformally on the surface of the structure shown in FIG. 4 by, for example, chemical vapor deposition (CVD) or atomic layer deposition (ALD).

Figure 6:
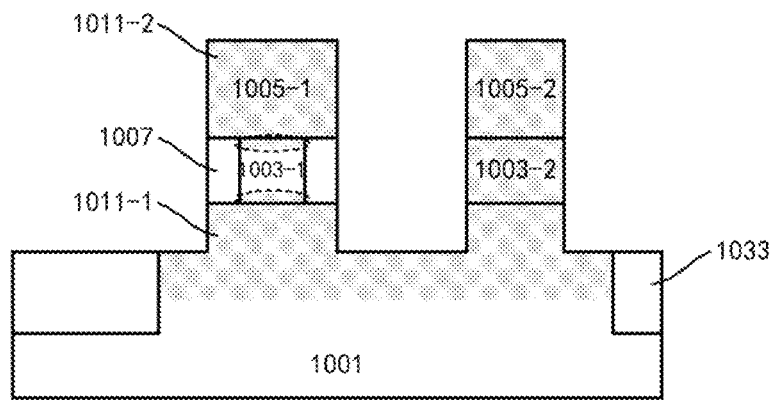

Next, as shown in FIG. 6, the dopant included in the dopant source layer 1009 may enter into the active region and the left pillar as a second stack by, for example, annealing, in order to form a doped region therein, as shown by the shaded portion in the figure. More specifically, one source/drain region 1011-1 may be formed in the substrate 1001, and another source/drain region 1011-2 may be formed in the first semiconductor layer 1005-1. In addition, the dopant also enters into a part of the substrate 1001, the second channel layer 1003-2, and the second semiconductor layer 1005-2 which constitute the second stack. As can be seen from FIG. 6, the dopant source layer 1009 includes a portion extending along the horizontal surface of the substrate 1001, so that the doped region formed in the substrate 1001 extends beyond the peripheries of the pillars. The first stack and the second stack, which are the pillars, are conductively connected together at the bottom through a horizontally extending portion of the doped substrate 1001, and after that, the dopant source layer 1009 may be removed.

In addition, although the sacrificial gate 1007 exists, the dopant may also enter into the first channel layer 1003-1 through the substrate 1001 and the first semiconductor layer 1005-1, so that certain doping distribution is formed at the upper and lower ends of the first channel layer 1003-1, as shown by the oval dashed circle in the figure. This doping distribution can reduce the resistance between the source and drain regions when the device is turned on, thereby improving device performance.

In the above example, the source/drain regions may be formed by driving a dopant from the dopant source layer into the active region, but the present disclosure is not limited thereto. For example, source/drain regions may be formed by ion implantation, plasma doping (for example, conformal doping along the surface of the structure in FIG. 4), or the like. Alternatively, in the process described above in connection with FIG. 1, a well region may be formed in the substrate 1001, and then a channel layer 1003 is grown thereon, and then a semiconductor layer 1005 is grown on the channel layer 1003 and doped in-situ. When the channel layer 1003 is grown, it may also be doped in-situ to adjust a threshold voltage ($V_t$) of the device.

Additionally, in order to reduce the contact resistance, the source/drain layers and the second stack may be siliconized. As shown in FIG. 7(*a*), for example, a layer of NiPt (or Co or Ti) may be deposited on the structure shown in FIG. 6, for example, with Pt content being about 2-10% and the thickness being about 2-10 nm, and annealed at a temperature of about 200-900° C. to cause NiPt to react with Si (in the source/drain layers) or SiGe (in 1003-2), thereby forming a metal semiconductor compound such as SiNiPt or SiGeNiPt. Thereafter, the remaining unreacted NiPt may be removed.

It should be noted that, since the second stack (i.e., the right pillar) is not used as an active region, but only used as a second contact portion, in another embodiment, as shown in FIG. 7(*b*), NiPt deposited on the second stack (that is, the right pillar) may fully react with the material (e.g., Si and SiGe) of the second stack. In the case where the right pillar is thin, the semiconductor material (such as doped silicon) in a part of the substrate and the second semiconductor layer 1005-2 and silicon germanium in the second channel layer 1006-2 may fully react with NiPt (or Co or Ti) deposited on the right pillar to completely generate a metal semiconductor compound (the metal semiconductor compound includes a metal silicide and/or a metal germanide silicide), thereby forming a entire metal semiconductor compound. Thereafter, the remaining unreacted NiPt may be removed.

Figure 8:
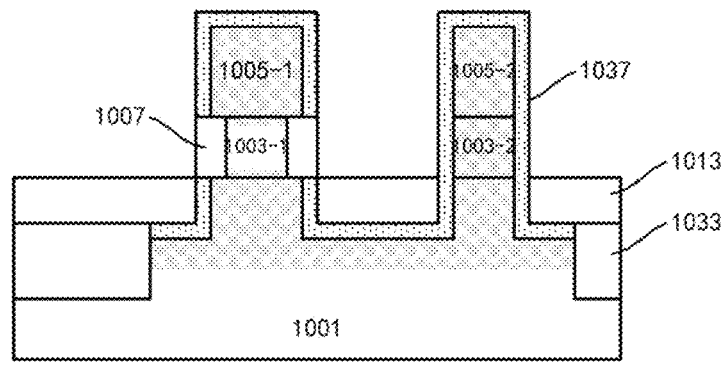

A second isolation layer may be formed over the substrate and the shallow trench isolation layer. Specifically, as shown in FIG. 8, an oxide is deposited over the substrate 1001 and the shallow trench isolation layer 1033 and etched back to a position of an interface between the channel layers 1003-1 and 1003-2 and the substrate 1001 (e.g., an interface between the SiGe layer and the Si layer) to form a second isolation layer 1013. Prior to etch-back, the deposited oxide may be subjected to a planarization process such as chemical mechanical polishing (CMP) or sputtering.

Figure 9:
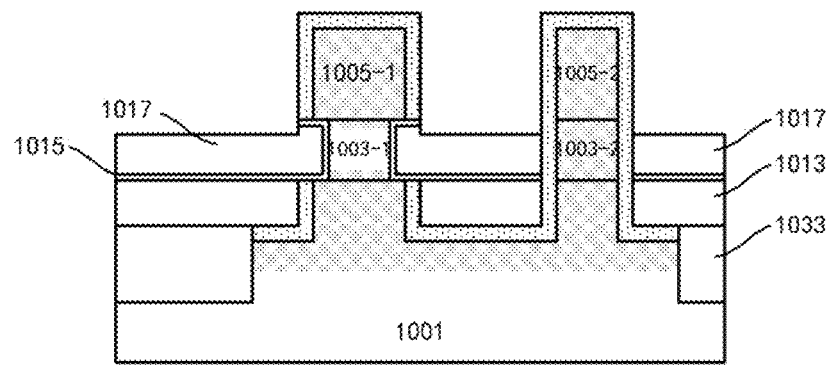

A gate dielectric layer and a gate conductor layer may be formed in the recesses. Specifically, as shown in FIG. 9, the sacrificial gate 1007 may be removed from the structure shown in FIG. 8, a gate dielectric layer 1015 and a gate conductor layer 1017 may be sequentially deposited, and the deposited gate conductor layer 1017 may be etched back. For example, the gate dielectric layer 1015 may include a high-K gate dielectric such as $HfO_2$; and the gate conductor layer 1017 may include a metal gate conductor. In addition, a work function adjustment layer may be formed between the gate dielectric layer 1015 and the gate conductor layer 1017, and the work function adjustment layer may include a threshold voltage Vt adjustment metal. Before the gate dielectric layer 1015 is formed, an interface layer such as an oxide may also be formed.

In this way, the gate dielectric layer 1015 and the gate conductor layer 1017 may be embedded in the recesses, and the top surfaces of the gate dielectric layer 1015 and the gate conductor layer 1017 are below the upper surface of the recesses.

Figure 10:
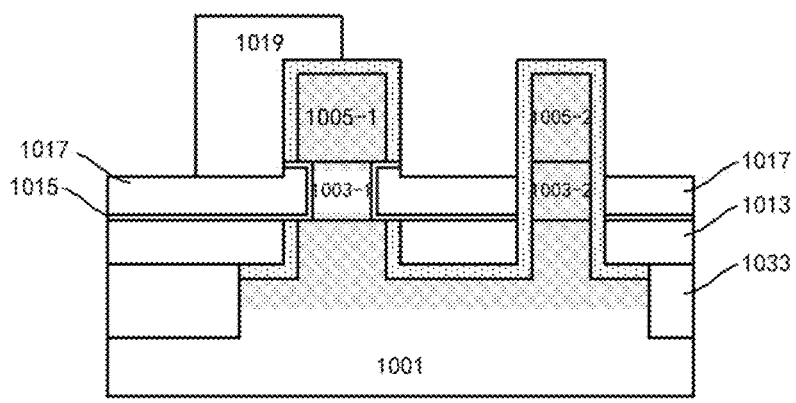
Figure 11:
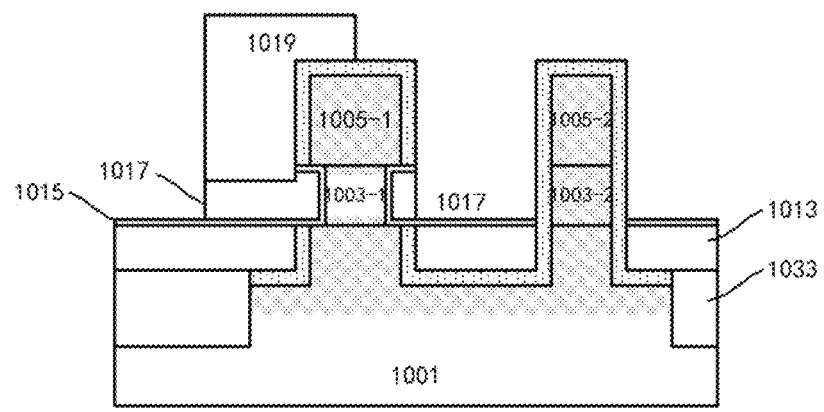

The gate conductor layer may be patterned to form a gate stack. Specifically, as shown in FIG. 10, a photoresist may be coated on the structure shown in FIG. 9, and the photoresist may be patterned to form a photoresist layer 1039, and then by using the photoresist layer 1039 as a mask, the gate conductor layer 1017 is selectively etched, such as RIE. As such, the gate conductor layer 1017 is etched off except for the portion left in the recesses and the portion blocked by the photoresist 1019. As shown in FIG. 11, the photoresist is removed, and the gate conductor layer is formed only around the first stack as the active region, and there is no gate conductor layer around the second stack. At this time, the gate conductor layer 1017 and the gate dielectric layer 1015 may form a gate stack. The gate stack has a laterally extending portion.

Figure 12:
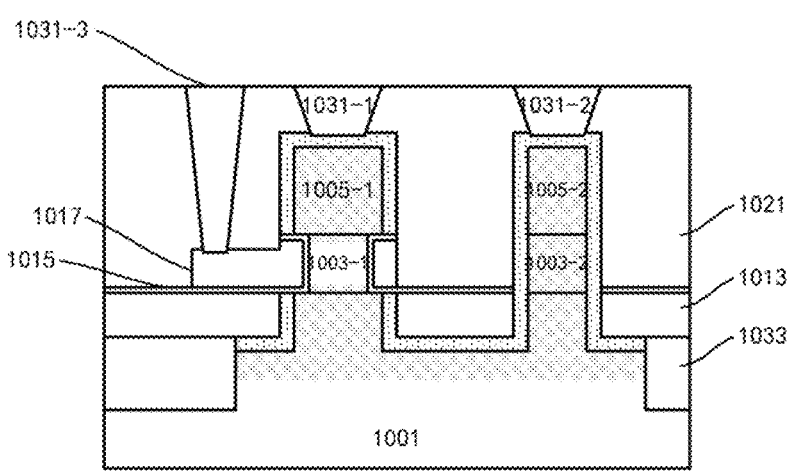

Then, as shown in FIG. 12, an interlayer dielectric layer 1021 may be formed on the structure shown in FIG. 11. Specifically, for example, an oxide may be deposited and planarized, such as CMP, to form the interlayer dielectric layer 1021, and the interlayer dielectric layer 1021 is planarized. The interlayer dielectric layer 1021 may be formed on the gate dielectric layer 1015, the gate conductor layer 1017, and a metal semiconductor compound (for example, metal silicide) layer above the second isolation layer 1013. A portion of the gate dielectric layer 1015 that does not form a gate stack with the gate conductor layer 1017 on the second isolation layer 1013 may be removed before the interlayer dielectric layer 1021 is formed. Thus, the interlayer dielectric layer 1021 is formed on the second isolation layer 1013, the gate conductor layer 1017 and the metal semiconductor compound layer.

Then, as shown in FIG. 12, three contact holes are respectively formed in the interlayer dielectric layer 1021 above the top surfaces of the two metal semiconductor compound layers and the laterally extending portion of the gate conductor layer: a first contact hole, a second contact hole, and a third contact hole. The three contact holes may expose the top surfaces of the two metal semiconductor compound layers and a top surface of the laterally extending portion of the gate conductor layer. The three contact holes are filled with a conductive material, thereby forming three contact plugs that respectively contact the top surfaces of the two metal semiconductor compound layers and the top surface of the laterally extending portion of the gate conductor layer: a first contact plug 1031-1, a second contact plug 1031-2, and a third contact plug 1031-3.

The first contact plug 1031-1 reaches the first semiconductor layer 1005-1 (serving as a second source/drain region) through a metal semiconductor compound layer formed over the first semiconductor layer 1005-1, thereby forming a first contact portion reaching the second source/drain region. The second contact plug 1031-2 reaches the doped substrate portion serving as a first source/drain region through the left pillar (the second stack) and the laterally extending portion of the doped substrate, thereby forming a second contact portion reaching the first source/drain region. The third contact plug 1031-3 is in contact with the laterally extending portion of the gate conductor layer and serves as a third contact portion.

Therefore, FIG. 12 illustrates a vertical type semiconductor device according to an embodiment of the present invention, in which a conductive contact having a high aspect ratio is formed using a conductive stacked pillar, thereby increasing the integration density and reducing the difficulty of forming the contact portion (avoiding, for example, the process difficulty of etching the contact hole using a plasma etching method and refilling the contact hole with a material such as metal). At the same time, the number of mask steps is reduced, thereby reducing manufacturing costs.

FIGS. 13 to 25 are schematic views illustrating a flow of manufacturing a semiconductor device according to another embodiment of the present disclosure.

Figure 13:
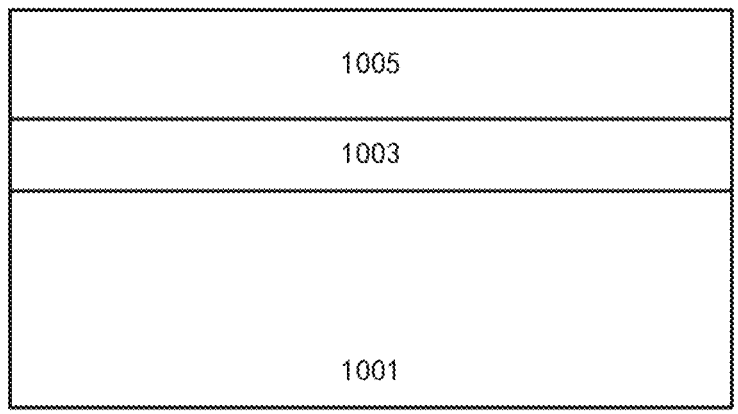
FIGS. 13 to 25 are schematic views illustrating a flow of manufacturing a semiconductor device according to another embodiment of the present disclosure.

Similar to FIG. 1, FIG. 13 illustrates a substrate 1001 and a channel layer 1003 and another semiconductor layer 1005 sequentially epitaxially grown thereon. The substrate 1001 includes, but is not limited to, a bulk semiconductor material substrate such as a bulk Si substrate, a semiconductor on insulator (SOI) substrate, a compound semiconductor substrate such as a SiGe substrate, or the like. For example, the channel layer 1003 may include a semiconductor material different from the substrate 1001 and the semiconductor layer 1005, such as SiGe (the atomic percentage of Ge may be about 10-40%), with a thickness being about 10-100 nm; and the semiconductor layer 1005 may include the same semiconductor material as the substrate 1001, such as Si, with a thickness being about 20-50 nm. However, the present disclosure is not limited thereto. For example, the channel layer 1003 may include a semiconductor material which has the same constituent components as the substrate 1001 or the semiconductor layer 1005, but different component contents.

Figure 14A:
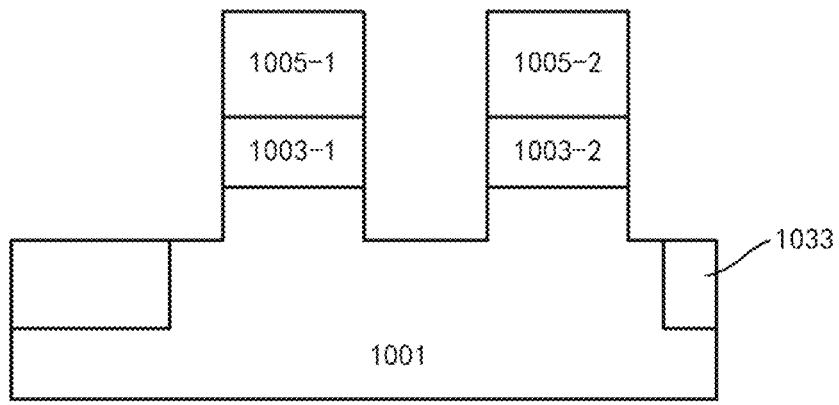
Figure 14B:
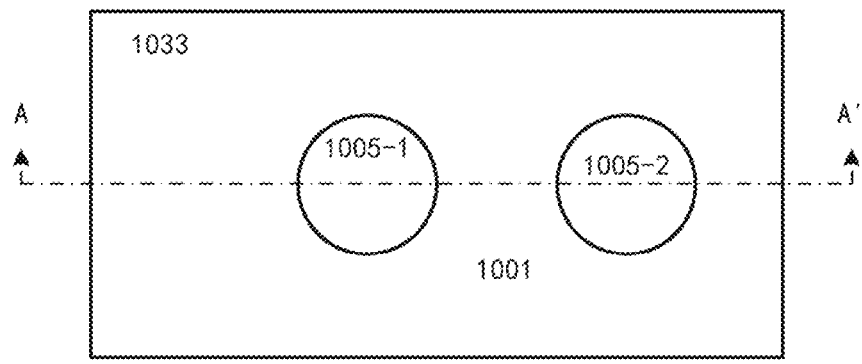

Next, an active region and a second contact portion of the device may be defined. Similar to FIGS. 2(*a*) and 2(*b*), as shown in FIGS. 14(*a*) and 14(*b*) (FIG. 14(*a*) is a cross-sectional view, and FIG. 14(*b*) is a top view, where AA' line indicates a position at which the cross section is taken), a photoresist (not shown) may be formed on the stack of the substrate 1001, the channel layer 1003, and the semiconductor layer 1005 as shown in FIG. 13, the photoresist is patterned into two desired shapes (in this example, which are approximately circular, but other shapes such as rectangles may also be used) by photolithography (exposure and development). By using the patterned photoresist as a mask, the semiconductor layer 1005, the channel layer 1003, and the substrate 1001 are selectively etched in sequence, such as reactive ion etching (RIE). The etching proceeds into the substrate 1001, but does not proceed to a bottom surface of the substrate 1001. Thus, after the etching, the semiconductor layer 1005, the channel layer 1003, and an upper portion of the substrate 1001 are formed into two pillars (in this example, cylindrical shapes). Accordingly, the semiconductor layer 1005 is formed into two parts: a first semiconductor layer 1005-1 and a second semiconductor layer 1005-2, and the channel layer 1003 is formed into two parts: a first channel layer 1003-1 and a second channel layer 1003-2. Since the patterning of the active region material layer is stopped before proceeding to the bottom surface of the substrate 1001, the active region material layer is patterned as a first stack (i.e., a pillar on the left) serving as an active region and a second stack (i.e., a pillar on the right) serving as a second contact portion, and the first stack and the second stack are connected together at the bottom. RIE may be performed, for example, in a direction substantially perpendicular to a substrate surface, so that the first stack and the second stack are also approximately perpendicular to the substrate surface. Thereafter, the photoresist may be removed.

A first isolation layer such as a shallow trench isolation layer 1033 may be formed around the first stack (the active region) and the second stack to achieve electrical isolation. For example, as shown in FIG. 14(*a*), a trench may be patterned on the structure, and an oxide may be deposited and etched back to a position on the upper surface of the bottom of the substrate 1001 to form the first isolation layer 1033. Prior to etch-back, the deposited oxide may be subjected to a planarization process such as chemical mechanical polishing (CMP) or sputtering. Herein, a top surface of the first isolation layer 1033 may be close to an interface between the channel layer 1003 and the substrate 1001.

Figure 15:
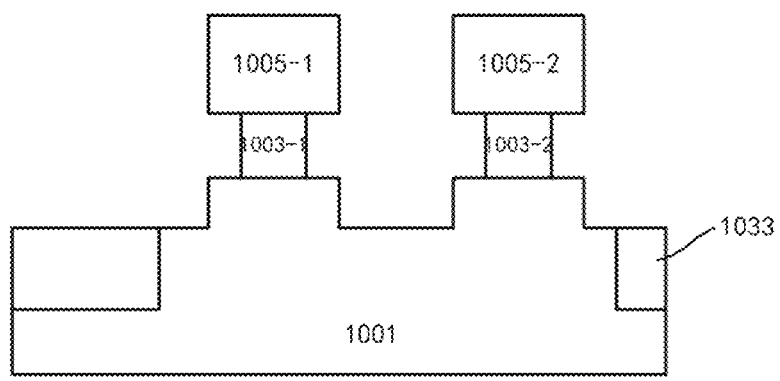

Then, as shown in FIG. 15, peripheries of the first channel layer 1003-1 and the second channel layer 1003-2 may be recessed with respect to the substrate 1001 and the peripheries of the first semiconductor layer 1005-1 and the second semiconductor layer 1005-2, respectively (in this example, recessed in a lateral direction substantially parallel to the substrate surface). For example, this can be achieved by performing further selective etching to the channel layers 1003-1 and 1003-2 with respect to the substrate 1001 and the first and second semiconductor layers 1005-1 and 1005-2. For example, atomic layer etching or digital etching may be used for selective etching. For example, heat processing is first performed, so that the surfaces of the substrate 1001, the channel layers 1003-1 and 1003-2, and the semiconductor layers 1005-1 and 1005-2 are oxidized, and then their respective surface oxide layers are removed.

In the case where the channel layers 1003-1 and 1003-2 are SiGe and the substrate 1001 and the semiconductor layers 1005-1 and 1005-2 are Si, the oxidation rate of SiGe is higher than that of Si, and the oxide on SiGe is easier to remove. The oxidation-removal oxide step may be repeated to achieve a desired recess. Compared with selective etching, this method can better control the degree of recessing.

As such, the active region of the semiconductor device is defined (the left pillar as shown in FIG. 3, including the etched substrate 1001, especially the upper portion thereof, the first channel layer 1003-1, and the first semiconductor layer 1005-1), while also defining a second stack in which the middle layer portion is recessed. In this example, the active region is substantially columnar. In the active region, the periphery of the upper portion of the substrate 1001 and the periphery of the first semiconductor layer 1005-1 are substantially aligned, but the periphery of the first channel layer 1003-1 is relatively recessed. The upper and lower side walls of this recess are respectively defined by the interface between the first channel layer 1003-1 and the first semiconductor layer 1005-1 and the interface between the first channel layer 1003-1 and the substrate 1001. Similarly, the second stack is substantially columnar. In the second stack, the periphery of the upper portion (the lower end portion of the second stack) of the substrate 1001 and the periphery of the second semiconductor layer 1005-2 (the upper end portion of the second stack) are substantially aligned, but the periphery of the second channel layer 1003-2 (the middle layer portion of the second stack) is relatively recessed. The upper and lower side walls of this recess are respectively defined by an interface between the middle layer portion 1003-2 of the second stack and the upper end portion 1005-2 and an interface between the middle layer portion 1003-2 and the substrate 1001 (the lower end portion).

However, the shapes of the active region and the second stack are not limited thereto, and other shapes may be formed according to a design layout. For example, in a top view, the active region and/or the second stack may be oval, square, rectangular, or the like.

Figure 16:
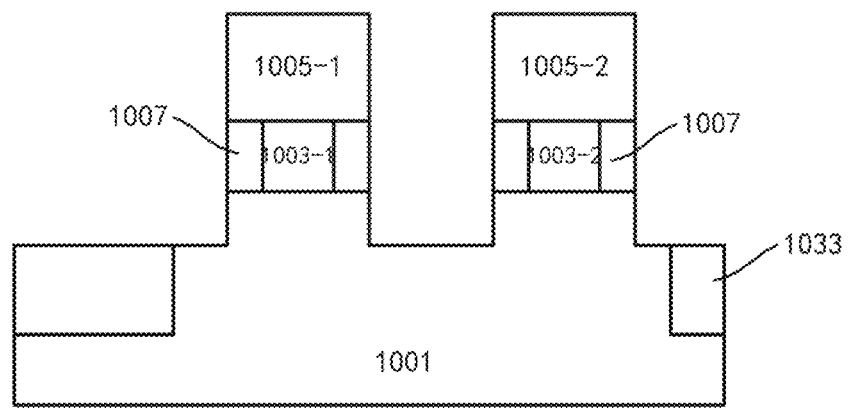

A material layer is then filled in the recess for use as a sacrificial material. This can be done by depositing a nitrogen oxide on the structure shown in FIG. 15 and then performing etching-back such as RIE to the deposited nitrogen oxide. RIE can be performed in a direction substantially perpendicular to the substrate surface to remove excess nitrogen oxide, and at the same time remove the nitrogen oxide formed on the right pillar by the previous process, so that the nitrogen oxide may only remain in the recess to form a sacrificial material 1007, as shown in FIG. 16. In this case, the sacrificial material 1007 may substantially fill the above-mentioned recess.

Figure 17:
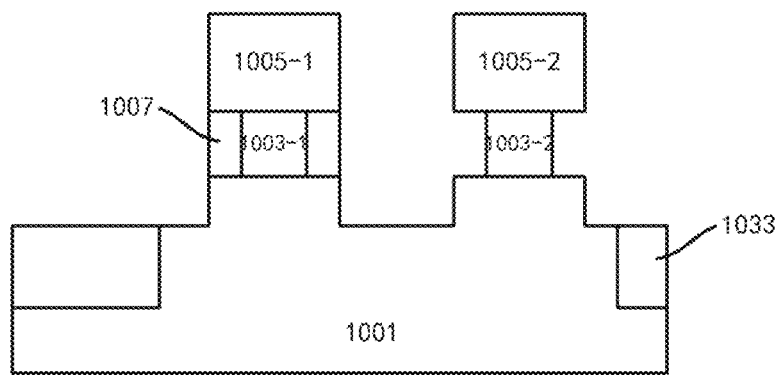

Next, the first stack serving as the active region may be covered, and the sacrificial material 1007 in the recess of the second stack serving as the second contact portion may be removed. Thereby, the structure as shown in FIG. 17 is obtained. After removing the sacrificial material 1007 in the recess of the second stack, SiGe or Si material may be selectively further etched to adjust a depth of the recess of the second stack, that is, a thickness of the middle layer portion of the second stack (for example, when the middle layer portion is cylindrical, adjusting a diameter of the cylinder).

Next, source/drain regions may be formed in the substrate 1001 and the first semiconductor layer 1005-1. This can be done by doping the substrate 1001 and the first semiconductor layer 1005-1. Meanwhile, the entire second stack is doped. For example, this can be done as follows.

Figure 18:
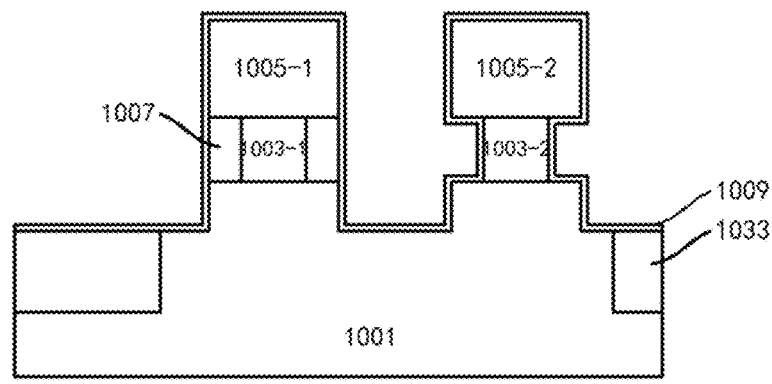

Specifically, as shown in FIG. 18, a dopant source layer 1009 may be formed on the structure shown in FIG. 17. For example, the dopant source layer 1009 may include an oxide such as silicon oxide, which contains a dopant. For an n-type device, an n-type dopant may be included; and for a p-type device, a p-type dopant may be included. Herein, the dopant source layer 1009 may be a thin film, so that it may be deposited substantially conformally on the surface of the structure shown in FIG. 17 by, for example, chemical vapor deposition (CVD) or atomic layer deposition (ALD).

Figure 19:
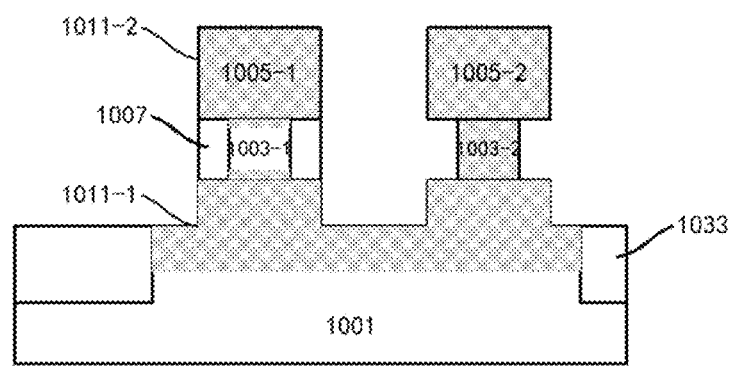

Next, as shown in FIG. 19, the dopant contained in the dopant source layer 1009 may enter into the active region and the second stack by, for example, annealing, thereby forming a doped region therein, as shown by the shaded portion in the figure. More specifically, one source/drain region 1011-1 may be formed in the substrate 1001, and another source/drain region 1011-2 may be formed in the first semiconductor layer 1005-1. In addition, the dopant also enters into a part of the substrate 1001, the second channel layer 1003-2, and the second semiconductor layer 1005-2 which constitute the second stack. As can be seen from FIG. 19, the dopant source layer 1009 includes a portion extending along the horizontal surface of the substrate 1001, so that the doped region formed in the substrate 1001 extends beyond the peripheries of the pillars. The first stack and the second stack, which are pillars, are conductively connected together at the bottom through a horizontally extending portion of the doped substrate 1001, and after that, the dopant source layer 1009 may be removed.

In addition, although the sacrificial material 1007 exists, the dopant may also enter into the first channel layer 1003-1 through the substrate 1001 and the first semiconductor layer 1005-1, so that certain doping distribution is formed at the upper and lower ends of the first channel layer 1003-1. This doping distribution can reduce the resistance between the source and drain regions when the device is turned on, thereby improving device performance.

In the above example, the source/drain regions may be formed by driving a dopant from the dopant source layer into the active region, but the present disclosure is not limited thereto. For example, source/drain regions may be formed by ion implantation, plasma doping (for example, conformal doping along the surface of the structure in FIG. 4), or the like. Alternatively, in the process described above in connection with FIG. 1, a well region may be formed in the substrate 1001, and then a channel layer 1003 is grown thereon, and then a semiconductor layer 1005 is grown on the channel layer 1003 and doped in-situ. When the channel layer 1003 is grown, it may also be doped in-situ to adjust a threshold voltage ($V_t$) of the device.

In addition, in order to reduce the contact resistance, the source/drain layers and the second stack may be siliconized. As shown in FIG. 20(*a*), for example, a layer of NiPt (or Co or Ti) may be deposited on the structure shown in FIG. 19, for example, with Pt content being about 2-10% and the thickness being about 2-10 nm, and annealed at a temperature of about 200-900° C. to cause NiPt to react with Si (in the source/drain layers) or SiGe (in 1003-2), thereby forming a metal semiconductor compound such as SiNiPt or SiGeNiPt. Thereafter, the remaining unreacted NiPt may be removed.

Figure 20A:
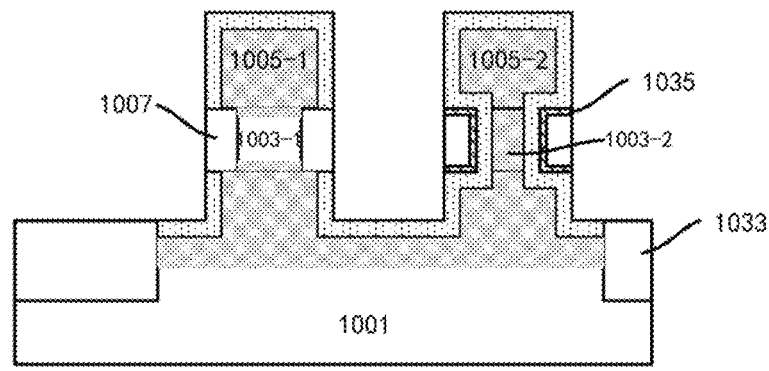
Figure 20B:
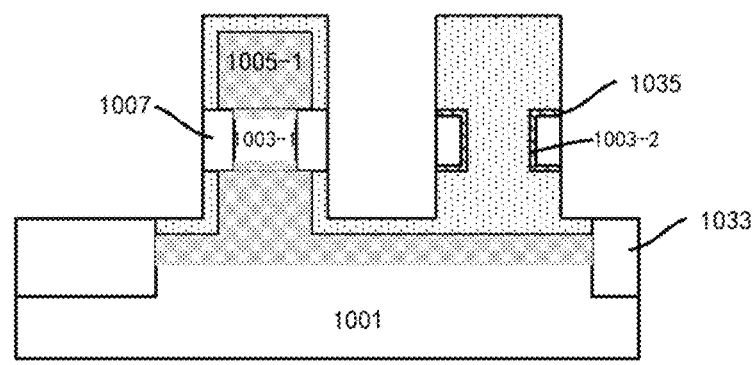

It should be noted that, since the second stack (i.e., the right pillar) is not used as an active region, but only used as a second contact portion, in another embodiment, as shown in FIG. 20(b), NiPt deposited on the second stack (that is, the right pillar) may fully react with the material (e.g., Si and SiGe) of the second stack. In the case where the right pillar is thin, the semiconductor material (such as doped silicon) in a part of the substrate and the second semiconductor layer 1005-2 and silicon germanium in the second channel layer 1006-2 may fully react with NiPt (or Co or Ti) deposited on the right pillar to completely generate a metal semiconductor compound (the metal semiconductor compound includes a metal silicide and/or a metal germanide silicide), thereby forming a entire metal semiconductor compound. Thereafter, the remaining unreacted NiPt may be removed.

Next, in the case where a sacrificial layer is filled in the recess of the first stack serving as the active region, a low-K dielectric layer is deposited in the recess of the second stack serving as the second contact portion. The low-K dielectric layer may thus be formed between the second stack serving as the second contact portion and a gate dielectric layer and a gate conductor layer to be formed subsequently, so that parasitic capacitance can be reduced. After the low-K dielectric layer is deposited in the recess, a sacrificial material 1007 is filled in the recess, which is the same as the aforementioned sacrificial material, such as a nitride. RIE is performed on the sacrificial material, and then the low-K dielectric layer is etched back, thereby only remaining the low-K dielectric layer 1035 and the sacrificial layer in the recess, as shown in FIGS. 20(a) and 20(b).

Figure 21:
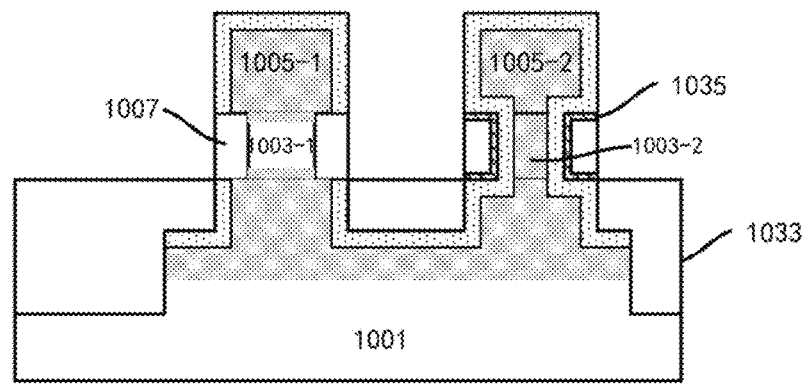

A second isolation layer may be formed over the substrate and the shallow trench isolation layer. Specifically, as shown in FIG. 21, an oxide is deposited over the substrate 1001 and the shallow trench isolation layer 1033 and etched back to a position of an interface between the channel layers 1003-1 and 1003-2 and the substrate 1001 (e.g., an interface between the SiGe layer and the Si layer) to form a second isolation layer 1013. Prior to etch-back, the deposited oxide may be subjected to a planarization process such as chemical mechanical polishing (CMP) or sputtering.

Figure 22:
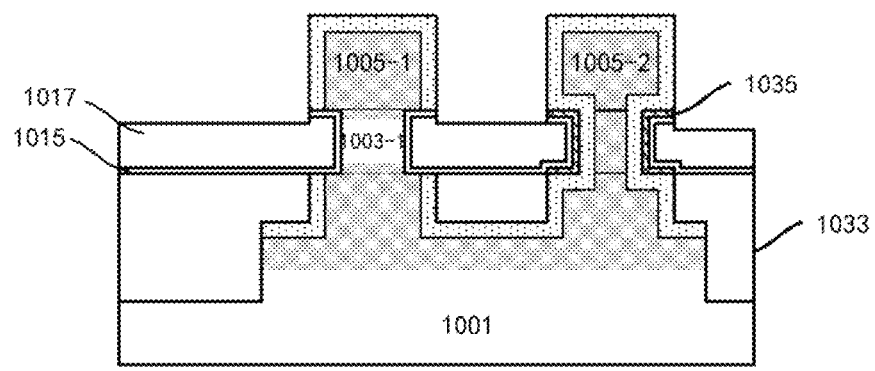

A gate dielectric layer and a gate conductor layer may be formed in the recesses. Specifically, as shown in FIG. 22, the sacrificial material 1007 may be removed from the structure shown in FIG. 21, a gate dielectric layer 1015 and a gate conductor layer 1017 may be sequentially deposited, and the deposited gate conductor layer 1017 may be etched back. For example, the gate dielectric layer 1015 may include a high-K gate dielectric such as $HfO_2$; and the gate conductor layer 1017 may include a metal gate conductor. In addition, a work function adjustment layer may be formed between the gate dielectric layer 1015 and the gate conductor layer 1017, and the work function adjustment layer may include a threshold voltage Vt adjustment metal. Before the gate dielectric layer 1015 is formed, an interface layer such as an oxide may also be formed.

In this way, the gate dielectric layer 1015 and the gate conductor layer 1017 may be embedded in the recesses of the first stack and the second stack, and the top surfaces of the gate dielectric layer 1015 and the gate conductor layer 1017 are below upper surfaces of the recesses.

Figure 23:
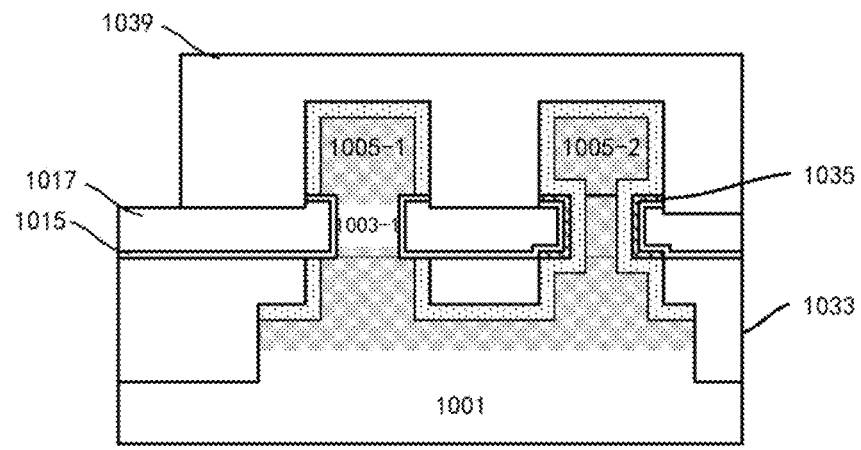
Figure 24A:
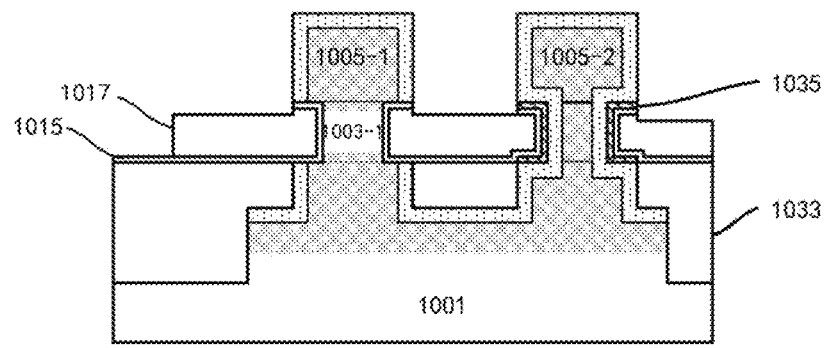
Figure 24B:
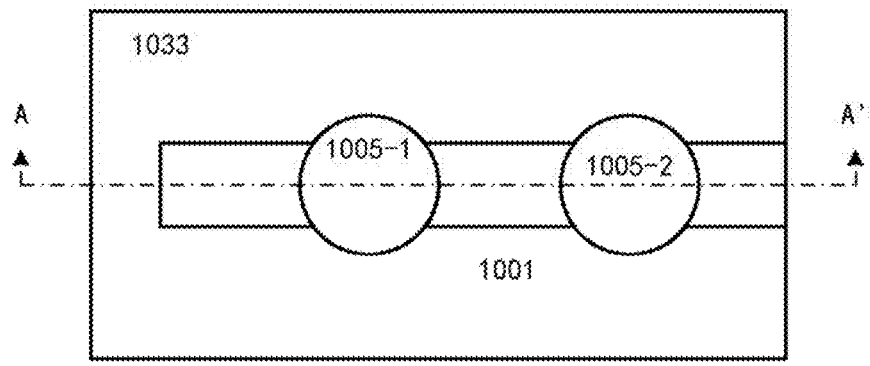

The gate conductor layer may be patterned to form a gate stack and a dummy gate stack. Specifically, as shown in FIG. 23, a photoresist may be coated on the structure shown in FIG. 22, and the photoresist may be patterned to form a photoresist layer 1039, and the photoresist layer 1039 covers the first stack and the second stack. Then, as shown in FIG. 24(a), by using the photoresist layer 1039 as a mask, the gate conductor layer 1017 is selectively etched, such as RIE. As such, the gate conductor layer 1017 is etched off except for the portion left in the recesses and the portion blocked by the photoresist 1019. In addition, the gate dielectric layer not covered by the gate conductor layer may be further etched, or the gate dielectric layer may be retained. Thereby, the gate conductor layer is formed around the first stack as the active region and the second stack as the second contact portion. At this time, the gate conductor layer 1017 and the gate dielectric layer 1015 around the first stack may form a gate stack having a laterally extending portion. The gate conductor layer 1017 and the gate dielectric layer 1015 around the second stack may form a dummy gate stack, which also has a laterally extending portion to both sides. And as shown in FIG. 24(b), the laterally extending portions of the dummy gate stack to both sides are connected to each other by the gate conductor layer in the recess of the middle layer portion, and the laterally extending portions of the dummy gate stack to the outside may be connected to another device.

Figure 25:
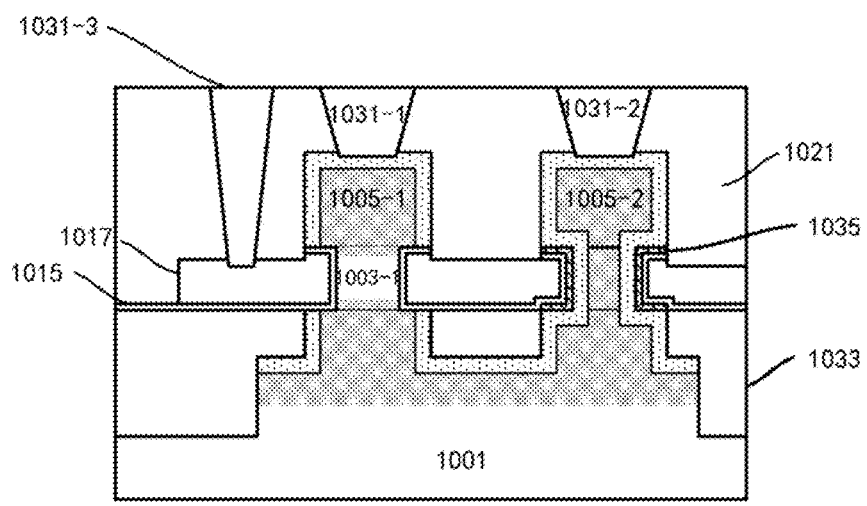

Then, as shown in FIG. 25, an interlayer dielectric layer 1021 may be formed on the structure shown in FIG. 24(a). Specifically, for example, an oxide may be deposited and planarized, such as CMP, to form the interlayer dielectric layer 1021, and the interlayer dielectric layer 1021 is planarized. The interlayer dielectric layer 1021 may be formed on the gate dielectric layer 1015, the gate conductor layer 1017, and the metal semiconductor compound layer above the second isolation layer 1013. A portion of the gate dielectric layer 1015 that does not form a gate stack with the gate conductor layer 1017 on the second isolation layer 1013 may be removed before the interlayer dielectric layer 1021 is formed. Thus, the interlayer dielectric layer 1021 is formed on the second isolation layer 1013, the gate conductor layer 1017, and the metal semiconductor compound layer.

Then, as shown in FIG. 25, three contact holes are respectively formed in the interlayer dielectric layer 1021 above the top surfaces of the two metal semiconductor compound layers and the laterally extending portion of the gate conductor layer: a first contact hole, a second contact hole, and a third contact hole. The three contact holes may expose the top surfaces of the two metal semiconductor compound layers and a top surface of the laterally extending portion of the gate conductor layer. The three contact holes are filled with a conductive material, thereby forming three contact plugs that respectively contact the top surfaces of the two metal semiconductor compound layers and the top surface of the laterally extending portion of the gate conductor layer: a first contact plug 1031-1, a second contact plug 1031-2, and a third contact plug 1031-3.

The first contact plug 1031-1 reaches the first semiconductor layer 1005-1 (serving as a second source/drain region) through a metal semiconductor compound layer formed over the first semiconductor layer 1005-1, thereby forming a first contact portion reaching the second source/drain region. The second contact plug 1031-2 reaches the doped substrate portion serving as a first source/drain region through the left pillar (the second stack) and the laterally extending portion of the doped substrate, thereby forming a second contact portion reaching the first source/drain region. The third contact plug 1031-3 is in contact with the laterally extending portion of the gate conductor layer, and serves as a third contact portion.

Therefore, FIG. 25 illustrates a vertical type semiconductor device according to another embodiment of the present invention. The difference from the previous embodiment is that a dummy gate stack structure is provided on the second stack to form the second contact portion, and a low-K dielectric layer is formed between the dummy gate stack and the conductive contact portion, thereby reducing parasitic capacitance.

In a further embodiment, in order to increase the conductivity, that is, to reduce the contact resistance of each contact portion, a process step of forming a conductive metal is added in the aforementioned processes. Specifically, FIGS. 26 to 30 are schematic views showing a flow of manufacturing a semiconductor device according to another embodiment of the present disclosure.

Since the first half of the flow of manufacturing a semiconductor device according to another embodiment of the present disclosure is the same as the first half of the flow of manufacturing a semiconductor device according to the previous embodiments (specifically referring to relevant descriptions of FIG. 1 to 7(a) or 7(b)), for the sake of brevity, it will not be repeated here.

Figure 7A:
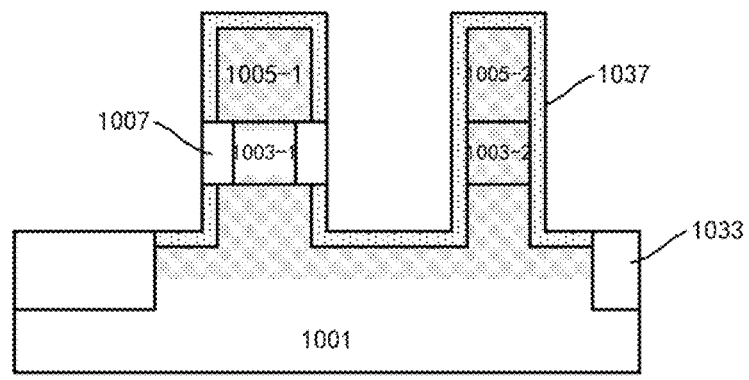
Figure 7B:
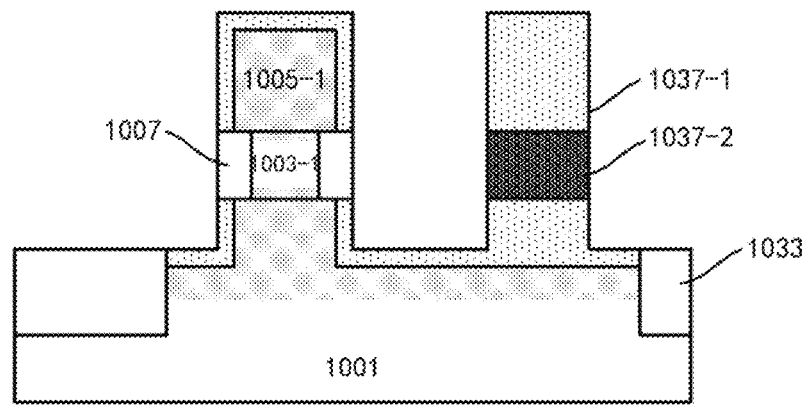
Figure 26:
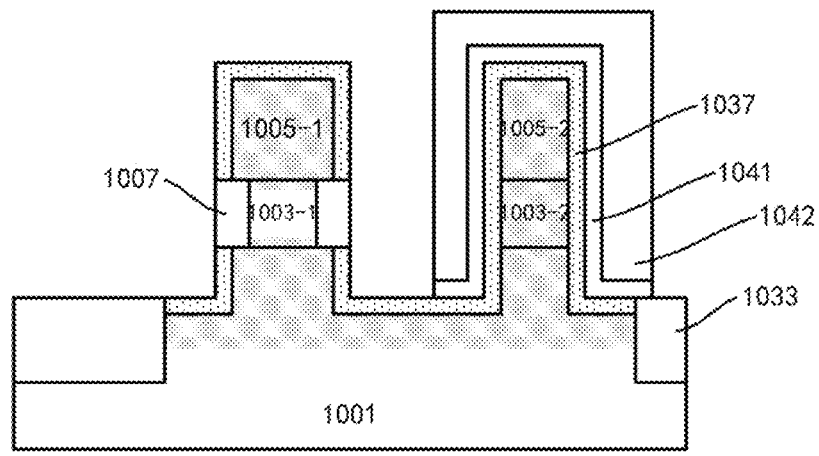
FIGS. 26 to 31 are schematic views illustrating a flow of manufacturing a semiconductor device according to still another embodiment of the present disclosure.

As shown in FIG. 26, a metal layer material is deposited on the structure shown in FIG. 7(a), and the metal layer material includes any one of the following: tungsten, cobalt, titanium, nickel, copper, molybdenum, aluminum, silver, beryllium, ruthenium, calcium, or a combination thereof. Then, a barrier layer/STI oxidation etch stop layer (not shown) is deposited as needed. The metal layer material is patterned by using a photoresist 1042, and the metal not covered by the photoresist 1042 is etched off, thereby forming a patterned metal layer 1041. The metal layer 1041 functions as a metal line or a metal contact.

Figure 27:
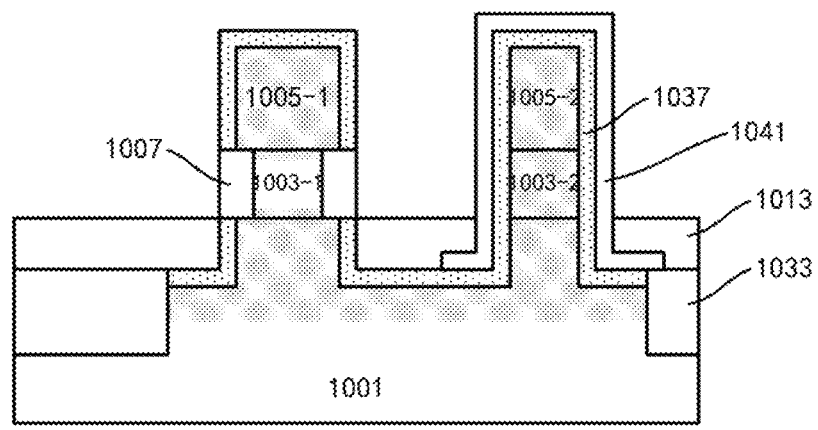

As shown in FIG. 27, an oxide is deposited over the substrate 1001 and the shallow trench isolation layer 1033 and etched back to a position of the interface between the channel layers 1003-1 and 1003-2 and the substrate 1001 (for example, the interface between the SiGe layer and the Si layer) to form a second isolation layer 1013. Prior to etch-back, the deposited oxide may be subjected to a planarization process such as chemical mechanical polishing (CMP) or sputtering.

Figure 28:
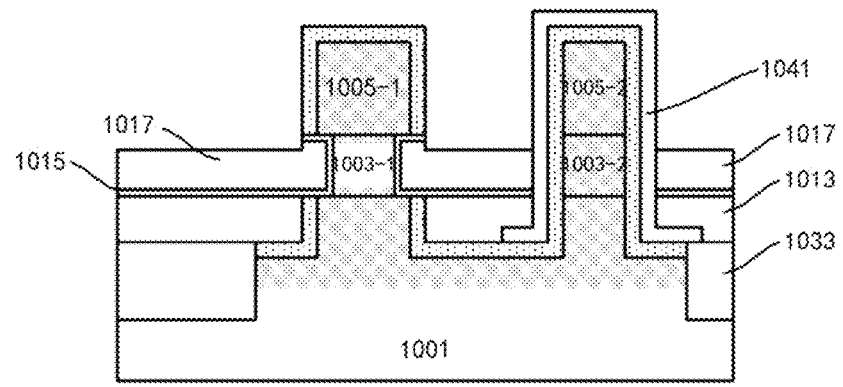

As shown in FIG. 28, a gate dielectric layer and a gate conductor layer may be formed in the recess. Specifically, the sacrificial gate 1007 may be removed from the structure shown in FIG. 27, a gate dielectric layer 1015 and a gate conductor layer 1017 may be sequentially deposited, and the deposited gate conductor layer 1017 may be etched back. For example, the gate dielectric layer 1015 may include a high-K gate dielectric such as $HfO_2$; and the gate conductor layer 1017 may include a metal gate conductor. In addition, a work function adjustment layer may be formed between the gate dielectric layer 1015 and the gate conductor layer 1017, and the work function adjustment layer may include a threshold voltage Vt adjustment metal. Before the gate dielectric layer 1015 is formed, an interface layer such as an oxide may also be formed.

In this way, the gate dielectric layer 1015 and the gate conductor layer 1017 may be embedded in the recess, and the top surfaces of the gate dielectric layer 1015 and the gate conductor layer 1017 are below the upper surface of the recess.

Figure 29:
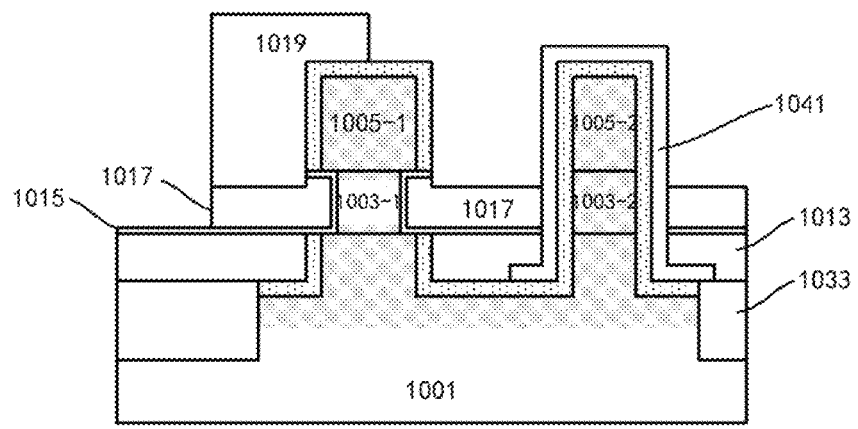
Figure 30:
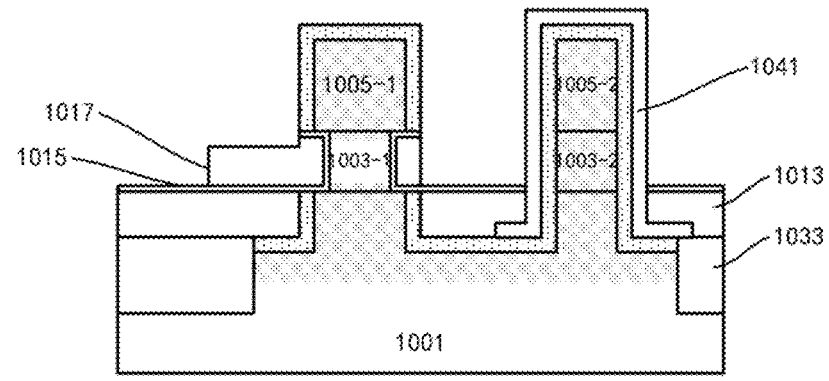

As shown in FIG. 29, the gate conductor layer may be patterned to form a gate stack. Specifically, a photoresist may be coated on the structure shown in FIG. 28, and the photoresist may be patterned to form a photoresist layer 1039, and then by using the photoresist layer 1039 as a mask, the gate conductor layer 1017 is selectively etched, such as RIE. As such, the gate conductor layer 1017 is etched off except for the portion left in the recess and the portion blocked by the photoresist 1019. Then, as shown in FIG. 30, the photoresist is removed, and the gate conductor layer is formed only around the first stack as the active region, and there is no gate conductor layer around the second stack. At this time, the gate conductor layer 1017 and the gate dielectric layer 1015 form a gate stack. The gate stack has a laterally extending portion.

An interlayer dielectric layer 1021 is formed on the structure shown in FIG. 30. Specifically, for example, an oxide may be deposited and planarized, such as CMP, to form the interlayer dielectric layer 1021, and the interlayer dielectric layer 1021 is planarized. The interlayer dielectric layer 1021 may be formed on the gate dielectric layer 1015, the gate conductor layer 1017, and the metal semiconductor compound (for example, metal silicide) layer above the second isolation layer 1013. A portion of the gate dielectric layer 1015 that does not form a gate stack with the gate conductor layer 1017 on the second isolation layer 1013 may be removed before the interlayer dielectric layer 1021 is formed. Thus, the interlayer dielectric layer 1021 is formed on the second isolation layer 1013, the gate conductor layer 1017, and the metal semiconductor compound layer.

Figure 31:
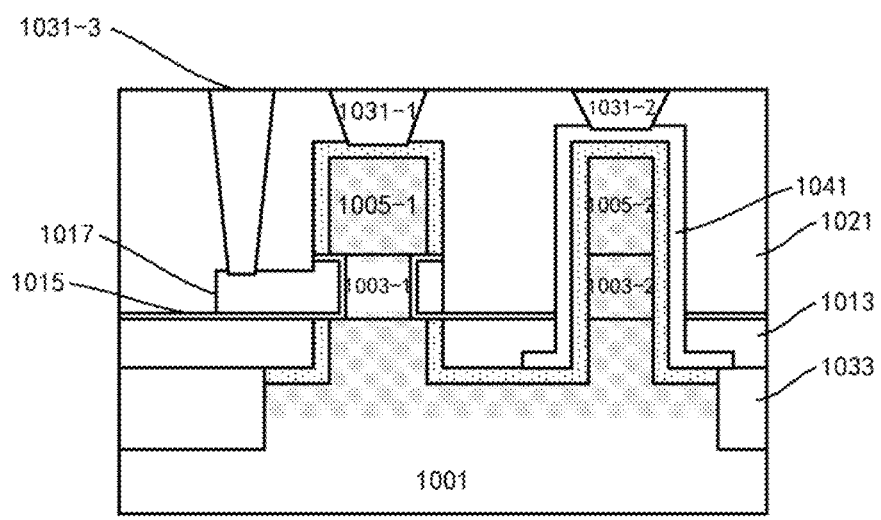

Then, as shown in FIG. 31, three contact holes are respectively formed in the interlayer dielectric layer 1021 above the top surfaces of the two metal semiconductor compound layers and the laterally extending portion of the gate conductor layer: a first contact hole, a second contact hole, and a third contact hole. The three contact holes may expose the top surfaces of the two metal semiconductor compound layers and a top surface of the laterally extending portion of the gate conductor layer. The three contact holes are filled with a conductive material, thereby forming three contact plugs that respectively contact the top surfaces of the two metal semiconductor compound layers and the top surface of the laterally extending portion of the gate conductor layer: a first contact plug 1031-1, a second contact plug 1031-2, and a third contact plug 1031-3.

The first contact plug 1031-1 reaches the first semiconductor layer 1005-1 (serving as a second source/drain region) through a metal semiconductor compound layer formed over the first semiconductor layer 1005-1, thereby forming a first contact portion reaching the second source/drain region. The second contact plug 1031-2 reaches the doped substrate portion serving as a first source/drain region through the left pillar (the second stack) and the laterally extending portion of the doped substrate, thereby forming a second contact portion reaching the first source/drain region. The third contact plug 1031-3 is in contact with the laterally extending portion of the gate conductor layer, and serves as a third contact portion. Since the metal layer 1041 is formed in advance between the second contact plug 1031-2 and the metal semiconductor compound layer, it contributes to achieving better conductive contact of the second contact portion, thereby increasing conductivity.

The semiconductor devices according to the embodiments of the present disclosure can be applied to various electronic apparatuses. For example, by integrating a plurality of such semiconductor devices and other devices (for example, other forms of transistors, etc.), an integrated circuit (IC) can be formed, and accordingly, an electronic apparatus can be constructed. Therefore, the present disclosure also provides an electronic apparatus including the semiconductor devices described above. The electronic apparatus may further include components such as a display screen cooperating with an integrated circuit and a wireless transceiver cooperating with the integrated circuit. Such electronic apparatuses may be, for example, smart phones, computers, tablet computers (PCs), artificial intelligence, wearable devices, mobile power sources, or the like.

According to an embodiment of the present disclosure, a method of manufacturing a system on chip (SoC) is also provided. The method may include the method of manufacturing a semiconductor device described above. Specifically, a variety of devices may be integrated on a chip, at least some of which are manufactured according to the method of the present disclosure.

In the above description, the technical details such as patterning and etching of each layer have not been described in detail. However, those skilled in the art should understand that various technical means can be used to form layers, regions, and the like in a desired shape. In addition, in order to form the same structure, those skilled in the art can also design methods that are not exactly the same as those described above. In addition, although the embodiments have been described separately above, this does not mean that the measures in the respective embodiments cannot be advantageously used in combination.

The embodiments of the present disclosure have been described above. However, these embodiments are for illustrative purposes only, and not intended to limit the scope of the present disclosure. The scope of the disclosure is defined by the following claims and their equivalents. Without departing from the scope of the present disclosure, those skilled in the art can make various substitutions and modifications which should all fall within the scope of the present disclosure.

I claim:

1. A semiconductor device comprising:
   a substrate;
   a vertical active region formed on the substrate and comprising a first source/drain region, a channel region, and a second source/drain region sequentially disposed in a vertical direction, the first source/drain region comprising a laterally extending portion extending beyond a portion of the active region above the laterally extending portion;
   a gate stack formed around a periphery of the channel region, the gate stack comprising a laterally extending portion; and
   a stack contact portion from above the laterally extending portion of the first source/drain region to the laterally extending portion of the first source/drain region,
   wherein the stack contact portion comprises a three-layer structure sequentially disposed in a vertical direction: a lower layer portion, a middle layer portion, and an upper layer portion, and
   wherein a semiconductor element in the lower layer portion is the same as a semiconductor element in the first source/drain region, or a semiconductor element in the upper layer portion is the same as a semiconductor element in the second source/drain region, and
   wherein a top surface of the middle layer portion is substantially level with a top surface of the channel region.

2. The semiconductor device according to claim 1, wherein positions of the lower layer portion, the middle layer portion and the upper layer portion of the stack contact portion are substantially aligned in a horizontal direction with positions of the first source/drain region, the channel region, and the second source/drain region constituting the vertical active region, respectively.

3. The semiconductor device according to claim 1, wherein a portion of elements constituting the stack contact portion is the same as elements constituting the first source/drain region or the channel region or the second source/drain region.

4. The semiconductor device according to claim 1, wherein the stack contact portion comprises a compound material composed of metal elements and semiconductor elements, and one of the semiconductor elements is at least the same as one of semiconductor elements in the first source/drain region or the channel region or the second source/drain region.

5. The semiconductor device according to claim 1, wherein the laterally extending portion of the first source/drain region comprises a compound material composed of metal elements and semiconductor elements, and one of the semiconductor elements is at least the same as one of semiconductor elements in the first source/drain region or the channel region.

6. The semiconductor device according to claim 1, wherein the stack contact portion and/or the laterally extending portion of the first source/drain region comprises a doped semiconductor.

7. The semiconductor device according to claim 1, wherein the middle layer portion comprises at least a same element as the channel region.

8. The semiconductor device according to claim 7, wherein the lower layer portion comprises a compound composed of first metal element and semiconductor elements, the middle layer portion comprises a compound composed of second metal element and semiconductor elements, and the upper layer portion comprises a compound composed of third metal element and semiconductor elements, and wherein one of the semiconductor elements in the compound of the lower layer portion is the same as one of the semiconductor elements in the first source/drain region, or one of the semiconductor elements in the compound of the middle layer portion is the same as one of the semiconductor elements in the channel region, or one of the semiconductor elements in the compound of the upper layer portion is the same as one of the semiconductor elements in the second source/drain region.

9. The semiconductor device according to claim 8, wherein the compound of the lower layer portion is on the same level as the first source/drain region, the compound of the middle layer portion is on the same level as the channel region, and the compound of the upper layer portion is on the same level as the second source/drain region.

10. The semiconductor device according to claim 1, further comprising a second contact plug from above the stack contact portion to the stack contact portion.

11. The semiconductor device according to claim 1, further comprising:
   a third contact plug to a gate conductor layer in the laterally extending portion of the gate stack, as a third contact portion.

12. The semiconductor device according to claim 7, wherein:
   the stack contact portion further comprises a dummy gate stack structure formed in a recess surrounding the middle layer portion on the same level as the channel region.

13. The semiconductor device according to claim 12, wherein the dummy gate stack structure comprises an insulating layer and a conductive layer sequentially stacked in the recess.

14. The semiconductor device according to claim 13, wherein the conductive layer forms an electrical connection with a portion of the laterally extending portion of the gate stack.

15. The semiconductor device according to claim 14, further comprising another electrode forming an electrical connection with the laterally extending portion of the gate stack through the conductive layer.

* * * * *